United States Patent [19]

Maskens

[11] Patent Number: 4,625,772
[45] Date of Patent: Dec. 2, 1986

[54] COMPONENT LEG BENDING DEVICE

[75] Inventor: Geoffrey D. Maskens, Blandford, United Kingdom

[73] Assignee: Ambotech Limited, Dorchester, England

[21] Appl. No.: 695,860

[22] PCT Filed: May 11, 1984

[86] PCT No.: PCT/GB84/00161

§ 371 Date: Jan. 22, 1985

§ 102(e) Date: Jan. 22, 1985

[87] PCT Pub. No.: WO84/04867

PCT Pub. Date: Dec. 6, 1984

[30] Foreign Application Priority Data

May 26, 1983 [GB] United Kingdom ............... 8314628

[51] Int. Cl.[4] .............................................. B21F 1/00
[52] U.S. Cl. .................................................. 140/105
[58] Field of Search ............................. 140/105, 71 R

[56] References Cited

U.S. PATENT DOCUMENTS 3,019,822 2/1962 Jacobson ........................ 140/71 R
4,151,637 5/1979 Zemek ............................. 140/105
4,288,914 9/1981 Vancelette ....................... 140/105
4,309,808 1/1982 Dean et al. ..................... 140/105

Primary Examiner—Lowell A. Larson
Attorney, Agent, or Firm—Klarquist, Sparkman, Campbell, Leigh & Whinston

[57] ABSTRACT

A device for bending a leg of a component inserted on a printed circuit board. The device comprises an anvil (3) connected to one end of a rod (10) rotatably mounted to a frame (8) of the device. The rod (10) is rotatable by a motor (4) via a gear transmission means (6, 7 and 9) and a piston and cylinder arrangement (22 and 23) is provided to pivot a rod (24) to cause the anvil (3) to be raised or lowered with respect to a component leg. The anvil (3) is movable in translation by means of a slider (20) connected to the anvil. The slider is disposed in a drum (16) rotatably mounted on a piston (17) of a piston and cylinder arrangement (21). One arm of a bifurcate member (18) pivotally mounted to an interior face of the drum engages in an aperture in the slider and the other arm rests on the piston rod so that movement of the piston rod causes the slider to move back and forth, rotation of the drum is effected by means of the motor (4) via transmission means.

11 Claims, 5 Drawing Figures

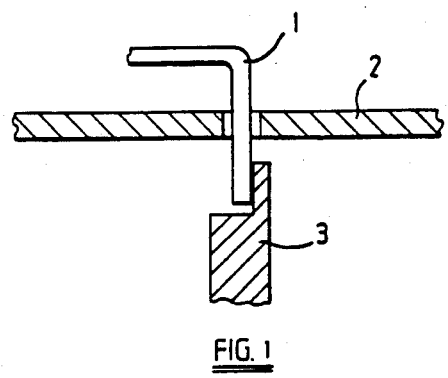
FIG. 1
FIG. 2
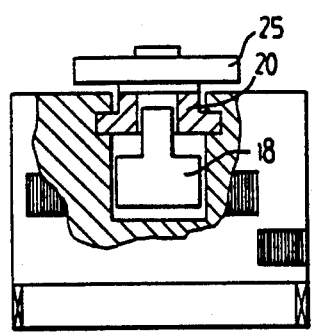
FIG. 3A
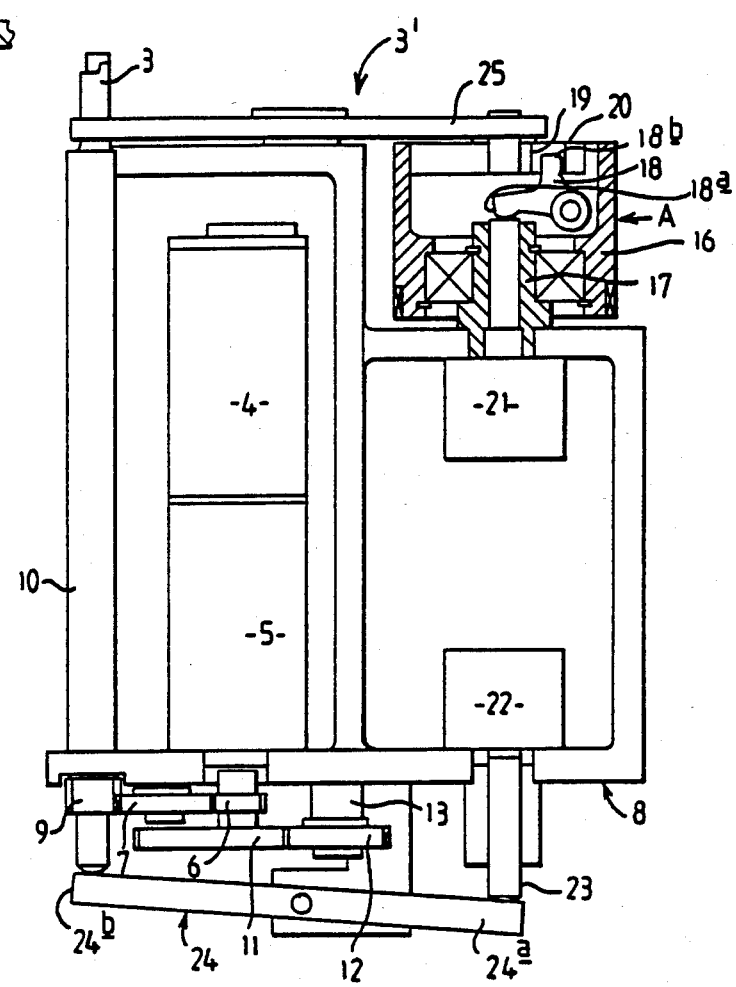
FIG. 3

COMPONENT LEG BENDING DEVICE

This invention relates to a device for bending a leg of a component inserted on a printed circuit board.

During the assembly of electronic components onto printed circuit boards, it is often necessary to hold a component onto the board by bending the leads or legs which protrude through the board in opposite directions prior to soldering or otherwise securing the component in place. Where the insertion is carried out automatically by machine, this is normally achieved by a simple mechanical device which is limited to bending the legs or leads only in (or alternatively out) with respect to the component and is not readily adjustable in different directions of bend, or lead pitch.

According to one aspect of the present invention, there is provided a device for bending a leg of a component inserted in a printed circuit board, comprising a member for engaging the leg of the component and means for moving the engaging member in any of a plurality of different directions so that the components leg can be bent in a selected direction.

In a second aspect, the present invention provides apparatus for bending the legs of a component inserted in a printed circuit board comprising a plurality of bending devices in accordance with the first aspect of the invention and means for controlling the moving means of the respective devices so as to control the relative movement of the respective members.

For a better understanding of the present invention, and to show how the same may be put into effect, reference will now be made, by way of example, to the accompany drawings, in which:

FIGS. 1 and 2 illustrate diagramatically the method by which a component lead is inserted into a printed circuit board;

FIG. 3 illustrates in plan view a device embodying the invention;

FIG. 3A is a view, partly in section, taken along the direction of arrow A in FIG. 3 of a drum of the device.

Figure 4:
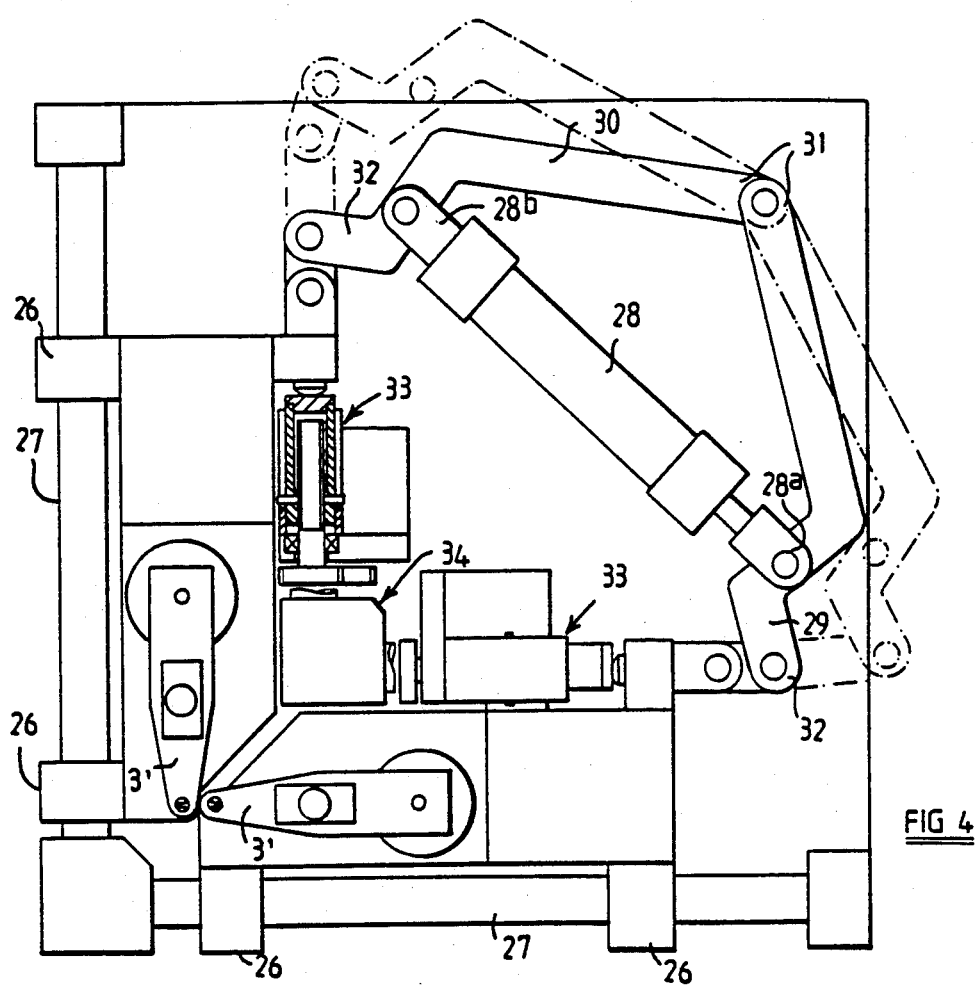
FIG. 4 illustrates apparatus comprising two of the devices shown in FIG. 3.

Referring now to the drawings, FIG. 1 shows a component lead or leg 1 protruding through a printed circuit board 2 onto an anvil 3 of a bending device which is constrained to move the anvil 3 in only one direction, that is, from right to left in the drawings. FIG. 2 shows how movement of the anvil 3 causes the components lead 1 to bend.

FIG. 3 illustrates diagrammatically a bending device embodying the invention.

The device 3' comprises a motor 4 connected to a gearbox 5. The output shaft of the bearbox 5 carries a first gear 6 which meshes with a second gear 7 rotatably mounted to a frame 8 of the device. The second gear 7 meshes with a third gear 9. One end of a rod 10 is mounted so as to be rotatable with the third gear 9. The rod 10 is freely rotatably mounted to the frame 8 so as to be both rotatable about its axis and pivotable with respect to the frame 8. The other end of the rod 10 carries the anvil 3 so that anvil 3 is rotatable with the rod 10 and is movable in translation when the rod 10 is pivoted.

A fourth gear 11 is also secured to the gearbox output shaft and meshes with a fifth gear 12 carried on one end of a shaft 13 rotatably mounted in the frame 8. The other end of the shaft 13 is connected by gearing to a drum 16 so that transmission is provided from the motor 4 to the anvil 3 and the drum 16.

A drum support shaft 17 extends into the drum 16 and is geared thereto. One arm 18a of a bifurcate rocking member 18 rests on the free end 17a of the drum support shaft. the other arm 18b of the rocking member 18 which is pivotally mounted to the interior of the drum is arranged to engage in an aperture 19 formed in a slider 20. The slider 20 is disposed in the drum so as to be rotatable with the drum and slidable in a radial direction of the drum. The slider 20 is connected via a rod 25 to the anvil 3. Rod 25 is pivotally and slidably mounted intermediate its ends, with one end of the rod 25 being pivotally mounted to the slider 20 and the other end of the rod 25 being pivotally mounted to the anvil 3.

FIG. 3a is a view along the arrow A of FIG. 3, partly in section showing the mounting of the slider.

The drum support shaft 17 forms the piston of an air piston and cylinder arrangement, the air cylinder 21 of which is actuable to raise or lower the drum support shaft 17 so as to pivot the rocking member 18 and cause the slider 20 to move back and forth.

A second air piston and cylinder arrangement has a cylinder 22 and piston rod 23 the free end of which rests on one end 24a of a rod 24 pivotally mounted to part of the frame. The other end 24b of the rod 24 supports the one end of the rod 10.

Rotation of the anvil 3 to the desired orientation is sensed or controlled by the motor in a conventional manner. The drum 18 is also rotated by the motor 18 in the same manner so that the slider 20 is orientated to push the anvil 3 in the desired direction. When the anvil is at the correct or intended angle, the air cylinder 22 is activated to depress the one end 24a of the rod 24 causing the anvil 3 to be brought into contact with the leg or lead to be bent. The air cylinder 21 is then activated to cause the rocking member 19 to pivot and push the slider 20, and therefore the anvil 3 in the desired direction. The anvil 3 is automatically returned to the rest position by deactivation of the cylinders 21 and 22, respectively, after a component lead or leg has been bent.

FIG. 4 illustrates schematically apparatus comprising two of the bending devices of FIG. 3, each bending device being arranged to bend a respective leg of a component each device is carried by respective slides 26 mounted on an associated guide 27.

The slides are movable by a piston and cylinder arrangement 26, one end 28a of which is pivotally connected to an intermediate portion of a first crank arm 29 and the other end 28b of which is pivotally connected to an intermediate portion of a second crank arm 30.

Adjacent ends 31 of the two arms are connected together and the other ends 32 thereof are pivotally connected to respective slides so that actuation of the piston and cylinder arrangement 28 forces the arms 29 and 30 either together or apart controlling relative movement of the slides. Respective shock absorbers 33 are mounted to the slides to prevent damage if the slides contact a block 34 provided to limit movement of the slide.

The arrangement of the piston and cylinder arrangement 28 and the crank arms 29 and 30 shown in solid lines in FIG. 4 is the position in which, as shown, the devices 3' are in a working condition to bend the legs of a component inserted in a printed circuit board while the arrangement of the piston and cylinder arrangement 28 and the crank arms 29 and 30 shown in dotted lines illustrates the position thereof when the devices are in a rest position.

Thus, by moving each device along the respective guides 27 which, in the arrangement shown, are mutually perpendicular, all points in an L-shape can be reached, and by appropriate programming all likely component leads positions can be reached using a printed circuit board assembly machine incorporating such apparatus.

I claim:

1. Apparatus for bending the legs of a component inserted into a printed circuit board, the apparatus comprising a plurality of bending devices, each bending device comprising:
   a frame;
   a member rotatably mounted to said frame for engaging a respective leg of a component;
   means for rotating the engaging member to a selected one of a plurality of orientations; and
   means for moving the engaging member in the selected orientation, the engaging member of each bending device being rotatable independently of the engaging member of the other bending device(s) so that the respective component leg associated with each bending device can be bent in a selected direction.

2. Apparatus according co claim 1, wherein each bending device comprises a slider which is connected to the respective engaging member and which is movable by a respective hydraulically actuated device for movement in translation.

3. Apparatus according to claim 2, wherein each hydraulically actuated device comprises a pivotally mounted bifurcate member having one arm engaging the respective slider and a second arm engaging a piston of the hydraulically actuated device.

4. Apparatus according to claim 3, wherein each bifurcate member is pivotally mounted to an inner surface of a respective drum which is rotatable about the piston of the respective hydraulically actuated device.

5. Apparatus according to claim 4, wherein each drum is rotatable by a motor via transmission means.

6. Apparatus according to claim 1, wherein a respective piston and cylinder arrangement is provided to lower or raise each engaging member relative to a component leg.

7. Apparatus according to claim 1, including means for controlling relative movement between the bending devices.

8. Apparatus according to claim 7, wherein the controlling means comprises a respective further slider carrying each device and means for controlling movement of each further slide on a respective guide means so as to control relative movement between the devices.

9. Apparatus for bending the legs of a component inserted into a printed circuit board, the apparatus comprising a plurality of bending devices, each bending device comprising:
   a frame;
   a member rotatably land pivotably mounted to said frame for engaging a respective leg of a component;
   means for rotating said engaging member to a selected one of a plurality of orientations; and
   means for moving said engaging member in said selected orientation, said moving means including
   a slider connected to said engaging member,
   means for positioning said slider in said selected orientation,
   a pivotally mounted bifurcate member having first and second arms, said first arm engaging said slider, and
   a hydraulically actuated device having a piston engaging said second arm for causing said bifurcate member to pivot to move said slider in a direction parallel to said selected orientation thereby causing said engaging member to move in said selected orientation to bend a respective component leg associated with the bending device in a selected direction.

10. Apparatus for bending the legs of a component inserted into a printed circuit board, the apparatus comprising a plurality of bending devices, each bending device comprising:
    a frame;
    a member rotatably and pivotably mounted to said frame for engaging a respective leg of a component;
    means for rotating said engaging member to a selected one of a plurality of orientations; and
    means for moving said engaging member in said selected orientation, said moving means including
    an elongate member having first and second ends, said first end being pivotally mounted to said engaging member so that said elongate member extends transversely of said engaging member,
    a rotatable drum having an inner surface,
    a first hydraulically actuable device having a piston, said drum being rotatable about said piston,
    a slider mounted within said drum so as to be rotatable with said drum to enable said slider to be positioned in said selected orientation, said slider being slidable radially of said drum and being pivotally connected to said second end of said elongate member,
    a bifurcate member pivotally mounted within said drum having first and second arms, said first arm engaging said slider, and a second hydraulically actuated device having a piston engaging said second arm for causing said bifurcate member to pivot to move said slider in a direction parallel to said selected orientation thereby causing said engaging member to move in said selected orientation to bend a respective component leg associated with the bending device in a selected direction.

11. A device for bending the legs of a component inserted into a printed circuit board, the device comprising:
    a frame;
    a member rotatably and pivotably mounted to said frame for engaging a respective leg of a component;
    means for rotating said engaging member to a selected one of a plurality of orientations; and
    means for moving said engaging member in said selected orientation, said moving means including
    an elongate member having first and second ends, said first end being pivotally mounted to said engaging member so that said elongate member extends transversely of said engaging member,
    a rotatable drum having an inner surface,
    a first hydraulically actuable device having a piston, said drum being rotatable about said piston,
    a slider mounted within said drum so as to be rotatable with said drum to enable said slider to be positioned in said selected orientation, said slider being slidable radially of said drum and being pivotally connected to said second end of said elongate member, a bifurcate member pivotally mounted within said drum having first and second arms, said first arm engaging said slider, and a second hydraulically actuated device having a piston engaging said second arm for causing said bifurcate member to pivot to move said slider in a direction parallel to said selected orientation thereby causing said engaging member to move in said selected orientation to bend a respective component leg associated with the bending device in a selected direction.

* * * * *